(12) United States Patent
Dalton et al.

(10) Patent No.: US 6,598,993 B1
(45) Date of Patent: Jul. 29, 2003

(54) LIGHTING DEVICE (75) Inventors: David Richard Dalton, Turramurra (AU); John Robert Brown, Mosman (AU)

(73) Assignee: Eveready Battery Company, Inc., St. Louis, MO (US)

( * ) Notice: Subject to any disclaimer, the term of this patent is extended or adjusted under 35 U.S.C. 154(b) by 0 days.

(21) Appl. No.: 09/720,058

(22) PCT Filed: Jun. 18, 1999

(86) PCT No.: PCT/AU99/00494
§ 371 (c)(1),
(2), (4) Date: Mar. 26, 2001

(87) PCT Pub. No.: WO99/67567
PCT Pub. Date: Dec. 29, 1999

(30) Foreign Application Priority Data

Jun. 19, 1998 (AU) .............................................. PP4224

(51) Int. Cl.[7] .................................................. F21L 4/00
(52) U.S. Cl. ...................... 362/202; 362/188; 362/277; 362/319
(58) Field of Search ................................. 362/202, 188, 362/277, 319, 285, 280, 323, 187

(56) References Cited

U.S. PATENT DOCUMENTS

| | | | |
|---|---|---|---|
| 4,307,439 A | | 12/1981 | Sassmannshausen ........ 362/186 |
| 4,609,976 A | | 9/1986 | Geissler ....................... 362/202 |
| 5,560,705 A | * | 10/1996 | Shiau ........................... 362/188 |
| 5,588,739 A | * | 12/1996 | Nakao .......................... 362/205 |
| 5,735,594 A | | 4/1998 | Own ............................. 362/202 |
| 5,806,964 A | * | 9/1998 | Maglica ....................... 362/188 |
| 5,816,688 A | * | 10/1998 | Shui-Shang .................. 362/202 |
| 6,004,008 A | * | 12/1999 | Lai ............................... 362/202 |

FOREIGN PATENT DOCUMENTS

| | | |
|---|---|---|
| CN | 2260231 Y | 8/1997 |
| GB | 1400701 | 7/1975 |
| GB | 2209387 | 5/1989 |
| GB | 2242732 | 10/1991 |
| WO | 9428347 | 12/1994 |

* cited by examiner

Primary Examiner—Laura K. Tso
(74) Attorney, Agent, or Firm—Robert W. Welsh (57) ABSTRACT A lighting device (10) comprises a generally tubular body (12) having a dry cell cavity (14) adapted to contain one or more dry cells (16) for powering the light, the body having a rearward end (18) and a forward end (20). A cylindrical translucent lens (38) is fixedly mounted to the forward end of the body, and a lamp (32) is mounted to the body at or adjacent to the forward end thereof. The lamp is adapted to be electrically connected to dry cells contained within the body. A generally parabolic or cone shaped reflector (42) is slidably mounted to the cylindrical lens and located within the interior of the cylindrical lens. The reflector has an opening in the center thereof shaped to receive at least part of the lamp therethrough. The reflector is slidable in an axial direction (37) between an extended position in which the reflector is spaced away from the lamp and light emitting from the lamp shines through the cylindrical lens, and a retracted position in which the lamp extends at least part way through the opening in the reflector, and light emitting from the lamp is reflected in a forward direction by the reflector. Preferably the reflector is mounted to a sleeve (44) which is slidably mounted to the cylindrical lens. Alternatively, the cylindrical lens may be slidable on the lamp body, and the reflector fixedly mounted to the lens. The lens may have a rear end of lesser diameter than the forward end.

19 Claims, 11 Drawing Sheets

LIGHTING DEVICE

FIELD OF THE INVENTION

This invention relates to a dry cell powered lighting device of the type which can be used in different modes, one mode being a flashlight mode to provide a directed beam, and another being a lantern mode being to provide an area light or lantern to provide a multi directional spread of light.

BACKGROUND OF THE INVENTION

Lighting devices of the aforementioned type have been developed relatively recently and have proved to be commercially successful due to the wide range of applications for which such a light is suitable. One prior art light of this type is described in PCT Patent application No. PCT/AU94/00271 which application has proceeded to grant in Australia and other countries.

The lighting device has a tubular body in which slides a tubular area lens. At the end of the tubular area lens is a portable flashlight lens. The dry cell or cells are in their own cartridge carrier, and once assembled the tubular area lens slides in an annular space between the cartridge and the body. When the lighting device is in its flashlight mode the cylindrical lens is retracted into the body of the device thereby positioning the lamp at the focal point of a reflector which is mounted to the cylindrical lens. When the device is in lantern mode the cylindrical lens is slid forward, out of the body of the device so that the lamp is positioned rearward of the reflector and at the approximate centre of the cylindrical lens.

The arrangement consists of three sub-assemblies namely the lens sub-assembly, the battery cartridge sub-assembly and the body sub-assembly.

The numbers of sub-assemblies and moving parts renders the lighting devices expensive to make, and complex to assemble.

Further, complex moulds are required so as to provide rib structures and grooves to ensure that parts will be correctly assembled and will slide smoothly. This adds to the cost of production. One of the difficulties of the prior out lights is the need to increase the function of the area lens portion and its movement relative to the body and the cartridge. A complex system was devised to hold an O-ring on the area lens which engages a groove in the battery cartridge or the body, and the groove is of a complex shape to provide detents or stops at several locations.

This adds more parts as two O-rings are required which need to be hand assembled to the area lens. The complexity of the structure necessitates assembly of the body, cartridge and area lens in a specific sequence.

The body of the lighting device has, as mentioned above, an annular recess into which the cylindrical lens is receivable and the requirement to provide this recess complicates both the structure of the device and the manufacturing process. The device, for these reasons, is reasonably costly to produce and also the device produced in this manner is not particularly robust, and is fairly bulky. Also, the form of the body is dictated by the configuration of the cylindrical lens which accordingly restricts the range of designs which can be produced using this sliding lens arrangement.

SUMMARY OF THE INVENTION

According to a first aspect of the invention there is provided a lighting device comprising:

a generally tubular body having a dry cell cavity adapted to contain one or more dry cells for powering the lighting device, the body having a rearward end and a forward end, a cylindrical translucent lens fixedly mounted to the forward end of the body, a lamp mounted to the body at or adjacent to the forward end thereof, said lamp adapted to be electrically connected to dry cells contained within the body, a generally parabolic or cone shaped reflector slidably mounted relative to the cylindrical lens and located within the interior of the cylindrical lens, the reflector having an opening in the centre thereof shaped to receive at least part of the lamp therethrough, and the reflector being slideable in an axial direction between an extended position in which the reflector is spaced away from the lamp and light emitting from the lamp in use shines through the cylindrical lens, and a retracted position in which the lamp extends at least part way through the opening in the reflector, and light emitting from the lamp in use is reflected in a forward direction by the reflector.

Preferably the reflector is mounted to a sleeve which is slidably mounted to the cylindrical lens.

The body may be of lesser diameter then the cylindrical lens and a tapered transition section may join the body with the cylindrical lens. The tapered transition section may be translucent and it is preferably formed integrally with the cylindrical lens.

The cylindrical sleeve is preferably of larger diameter than the cylindrical lens, the sleeve having an inner surface which is slideable relative to the outer surface of the cylindrical lens. There may be sealing ring located between the lens and the sleeve. The scaling ring may comprise a ring seal mounted on the inner surface of the sleeve and slideable on the outer surface of the lens. The sleeve preferably has a transparent disc or cover sheet on the forward end thereof adapted to protect the reflector and the lamp.

Preferably the lamp is mounted on a removable mounting plate or hub which, when removed, exposes the dry cell cavity to allow for dry cell replacement. The lamp is preferably mounted so as to be positioned approximately adjacent the rearward end of the cylindrical lens. Where the lamp is mounted on a removable plate or hub, this plate or hub preferably has peripheral formations thereon adapted to engage with co-operant formations on the body to keep the lamp positioned and centralised.

Preferably the lighting device also includes a strap having a first end pivotally connected to the body and a second the other end having a quick release or bayonet fitting thereon, the body including a first receiving socket therein adapted to receive said second end therein, and the cylindrical sleeve including a second receiving socket for receiving the second end therein, the cylindrical sleeve being locked in position relative to the cylindrical lens when the second end is operatively located in said second socket According to another aspect of the invention there is provided a lighting device comprising:

a generally tubular body having a dry cell cavity adapted to contain one or more dry cells for powering the lighting device, the body having a rearward end and a forward end;

a generally cylindrical translucent lens slideably mounted to the outside of the body and extending forwardly of the forward end of the body;

a lamp mounted to the body at or adjacent to the forward end thereof, said lamp adapted to be electrically connected to said dry cell or cells contained within the body; and a generally parabolic or cone shaped reflector fixedly mounted to the cylindrical lens and located within the cylindrical lens, the reflector having an opening in the centre thereof shaped to receive at least part of the lamp therethrough, the reflector and tubular lens being slideable in an axial direction between an extended position in which the reflector is spaced away from the lamp and light emitting from the lamp in use shines through the tubular lens, and a retracted position in which the lamp extends at least part way through the opening in the reflector, and light emitting from the lamp in use is reflected in a forward direction by the reflector;

the rearward end of the cylindrical translucent lens being of lesser diameter than the forward end thereof.

Preferably the tubular lens is translucent for substantially its entire length.

Preferably the internal surfaces of said cylindrical lens and/or external surfaces of said body include detent formations so as to hold, at selected locations, said tubular lens relative to said body.

The lighting device may include a strap having one end pivotally connected to the body and the other end having a quick release or bayonet fitting thereon, the body including a first receiving socket therein adapted to receive said second end therein, and the cylindrical sleeve including a second receiving socket for receiving second end therein, the cylindrical sleeve being locked in position relative to the cylindrical lens when the second end is operatively located in said second socket.

Optionally the reflector is of wider diameter than the diameter of the body.

Optionally the back surface of the parabolic reflector can be silvered or moulded in a polymeric or plastic material which is white in colour or otherwise coloured silver or white, to aid in the dispersion of light outwardly through the cylindrical lens when the reflector is in the extended position. It is also possible for the rear surface of the lens to be formed into a shape that further aids the direction of light out through the cylindrical lens when the reflector is in the extended position.

These and further features of the invention are made apparent from the description of an embodiment thereof given below by way of example. In the description reference is made to the accompanying drawings but the specific features shown in the drawings should not be construed as limiting on the invention. In addition, should there be any doubt in the interpretation of this specification, the term "comprised" or "comprising" where used in the specification should be interpreted to be an inclusive term rather than an exclusive term.

Throughout the specification the word "translucent" is used as a description of a character of a material and includes transparent or clear characteristics, and any characteristic which permits the passage or conduction of light therethrough whether or not diffusion occurs.

Where the term "generally cylindrical" is used in the specification it is not intended to mean that the entire article to which the term is applied must be cylindrical in form. The lens 204, for example, should be interpreted as falling within the scope of the term.

DETAILED DESCRIPTION OF THE EMBODIMENTS

In the embodiment shown in FIGS., 1, 2, 3 and 4 of the drawings, a flashlight 10 has a cylindrical body 12, which defines a dry cell cavity 14, in which dry cells 16 are located to provide power for the flashlight. The cavity 14 is a blind cavity. The body 12 has a rearward end 18 and forward end 20. An on/off switch 22 is provided at the rearward end of the body and electrical circuitry 24 for controlling the operation of the flashlight is contained within a sealed compartment 26 located below the dry cell cavity 14. In the arrangement shown, the body is formed in two parts numbered 28 and 30, the rearward part 30 being separable from the forward part 28 to expose the circuitry 24.

Figure 1:
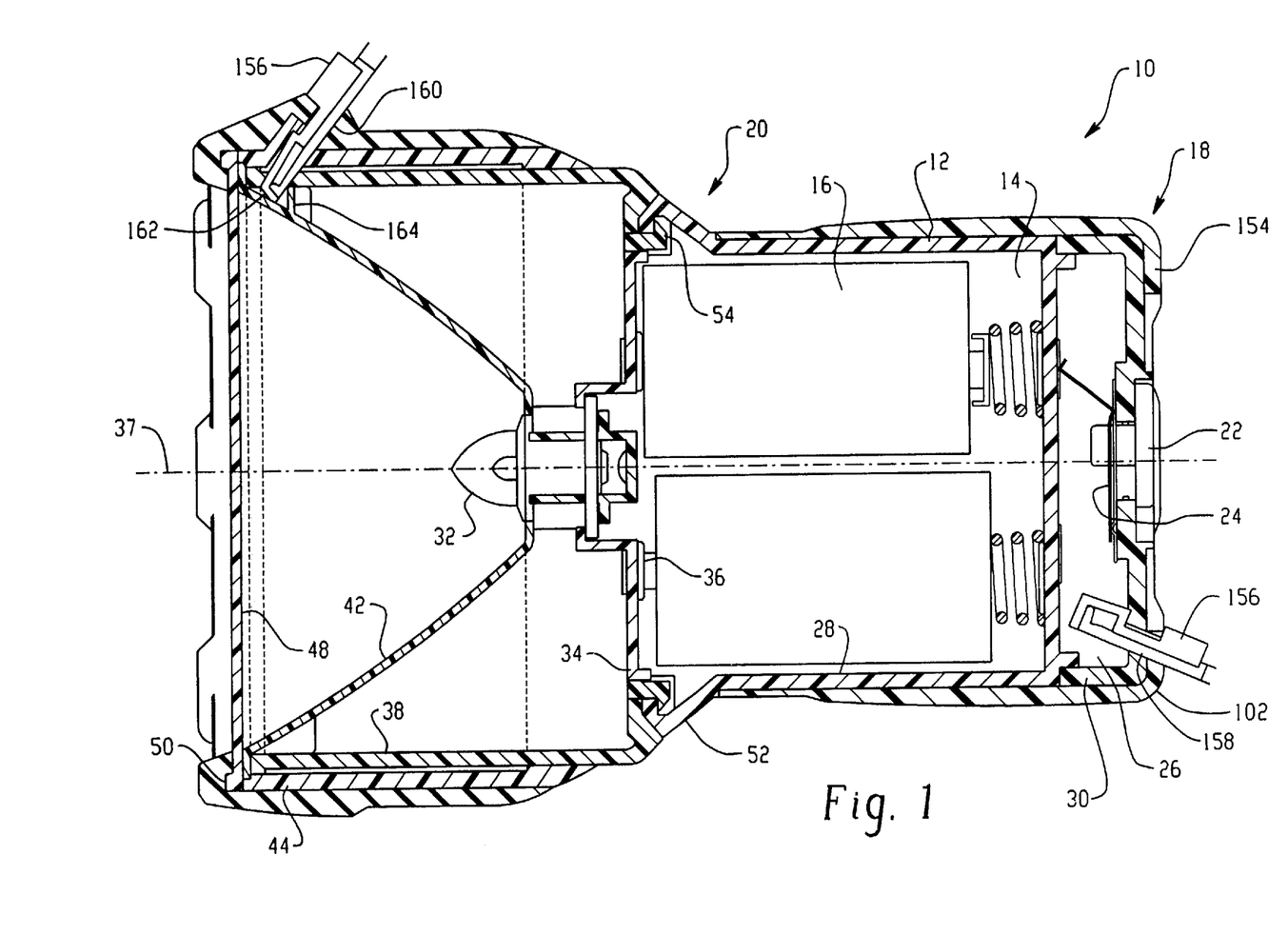
FIG. 1 shows a cross section or side view of a flashlight according to the invention with the sleeve in a retracted position.
Figure 2:
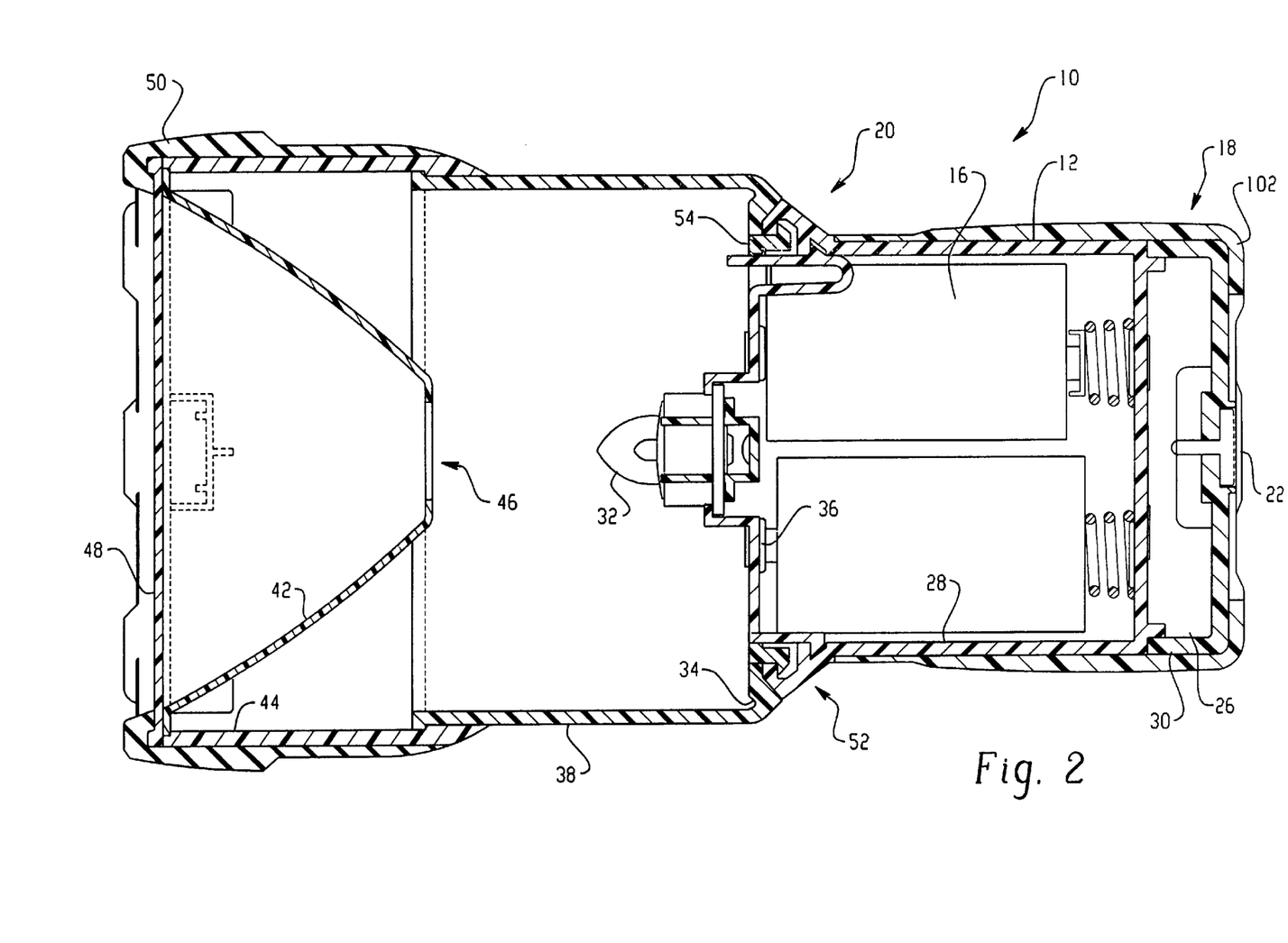
FIG. 2 shows a similar view of the flashlight depicted in FIG. 1 but with the sleeve in an extended position.
Figure 3:
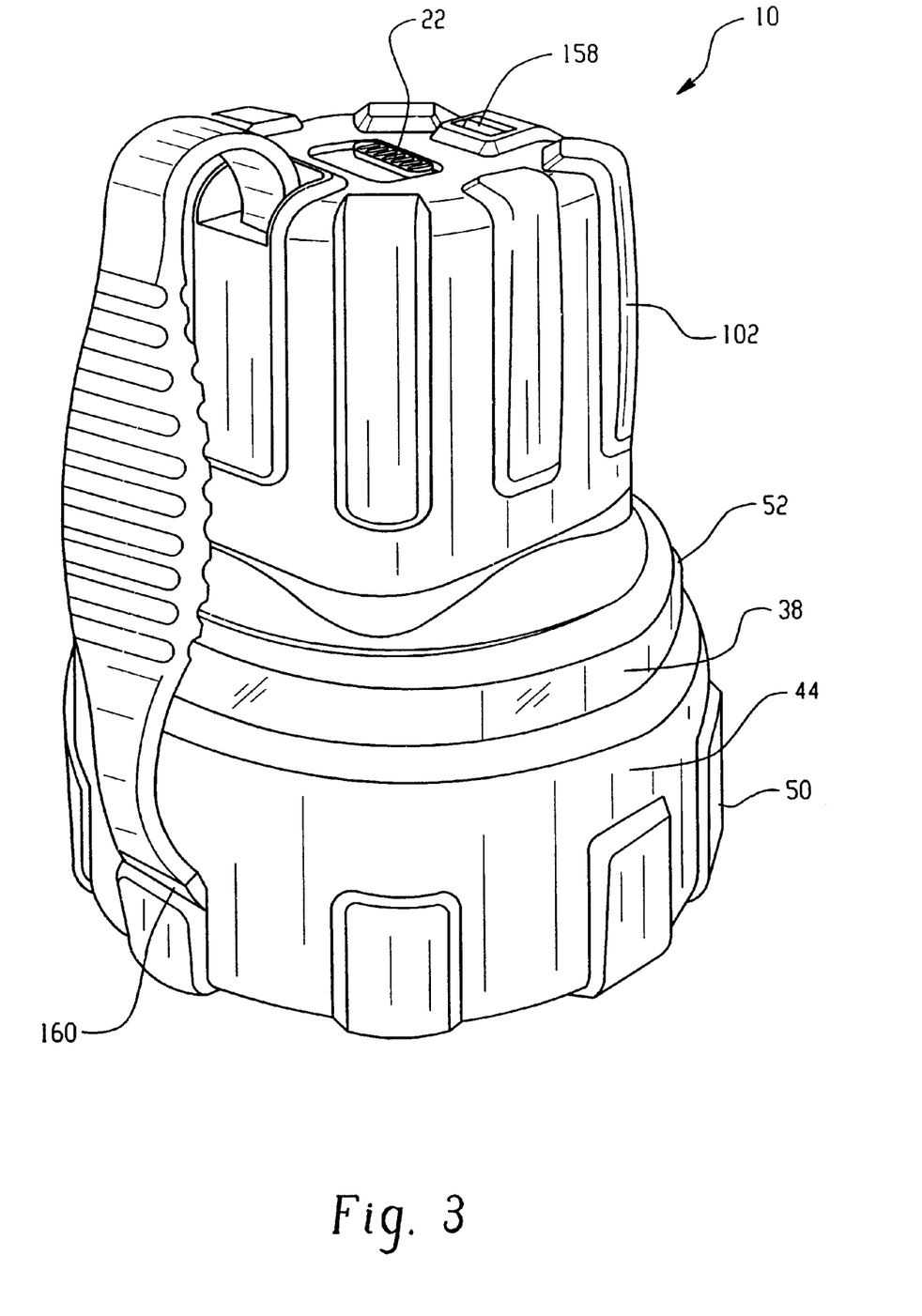
FIG. 3 shows a perspective view of the flashlight depicted in FIGS. 1 and 2.

A lamp 32 is mounted to the body by means of a mounting plate or hub 34 which is provided with contacts 36 for electrical connection with the forward ends of the drv cells 16. The mounting plate or hub 34 is removable from the body so as expose the dry cell chamber 14 and allow the dry cells to be inserted into or removed from the chamber 14. It will be noted that the lamp 32 is mounted on the longitudinal axis 37 of the flashlight. The dry cell chamber preferably has a plurality of dry cell shaped recesses defined therein so that dry cells inserted into the cavity will each be inserted into a respective dry cell shaped recesses so as to be held therein in correct alignment with the contacts. This avoids the need for a separate cartridge to hold the dry cells as is required in many multi-dry cell flashlights currently available.

Figure 9:
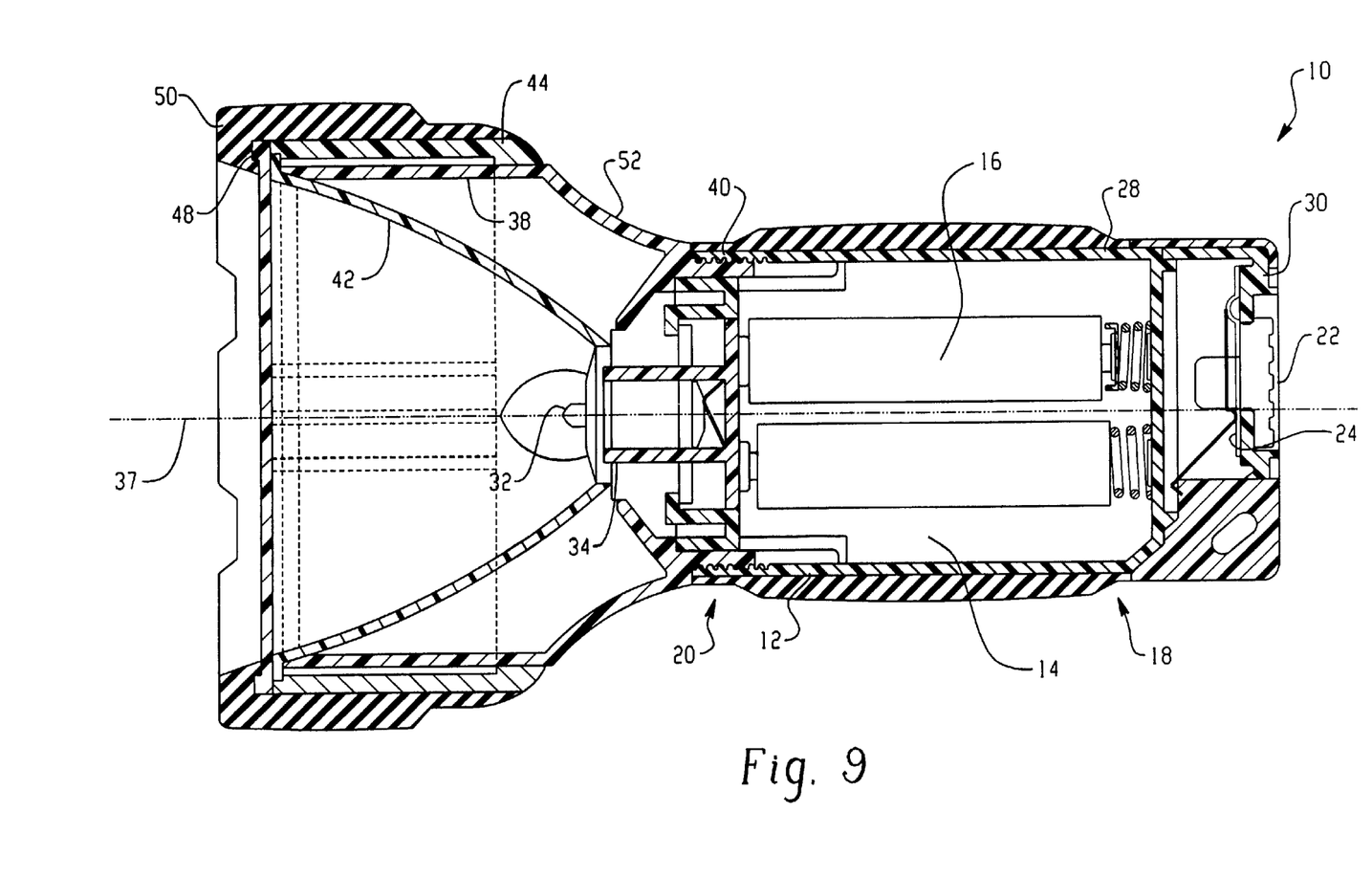
FIG. 9 illustrates a cross section through a third embodiment of the invention in flashlight mode.
Figure 10:
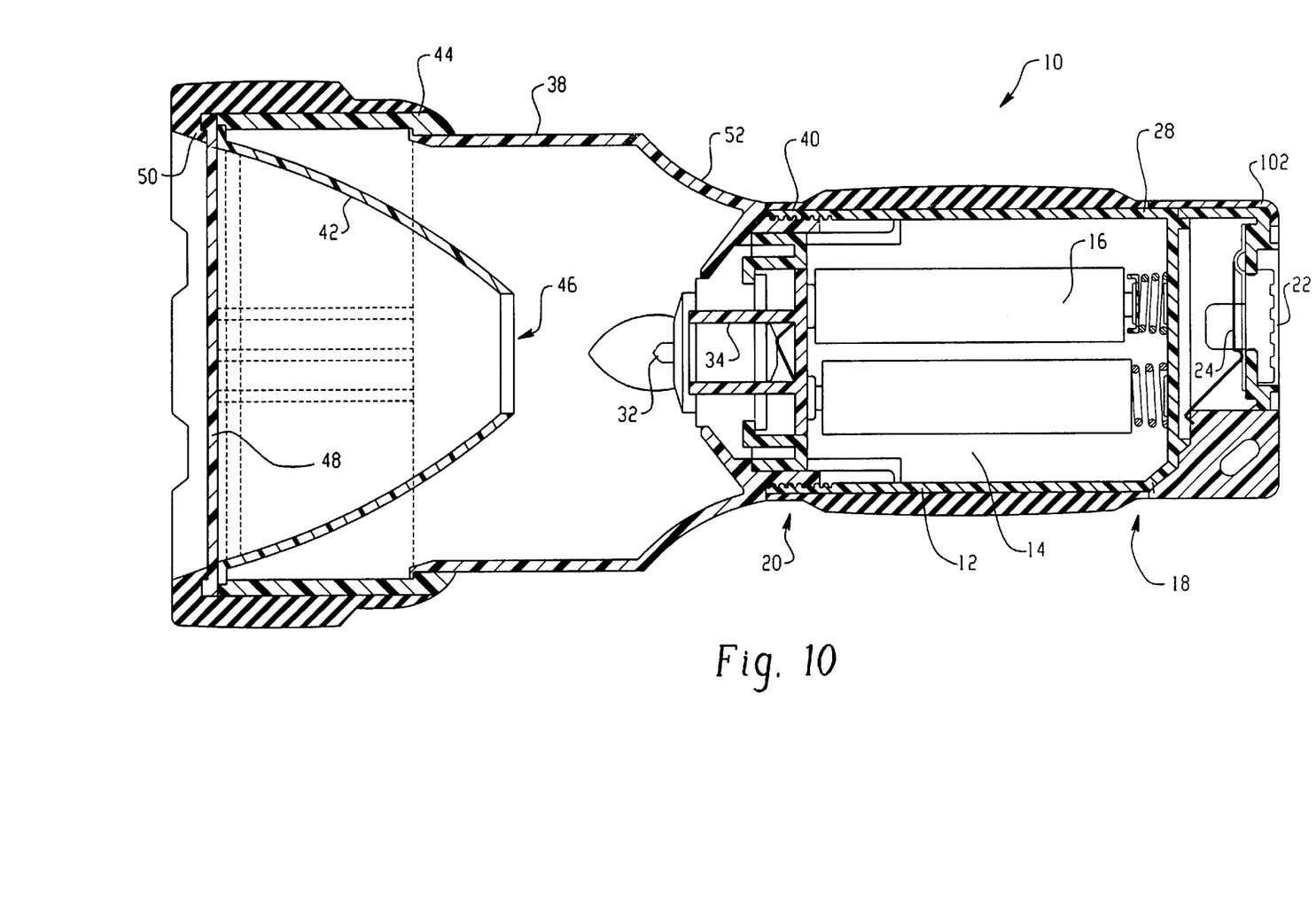
FIG. 10 illustrates a cross section through the embodiment depicted in FIG. 9 in lantern mode.
Figure 11:
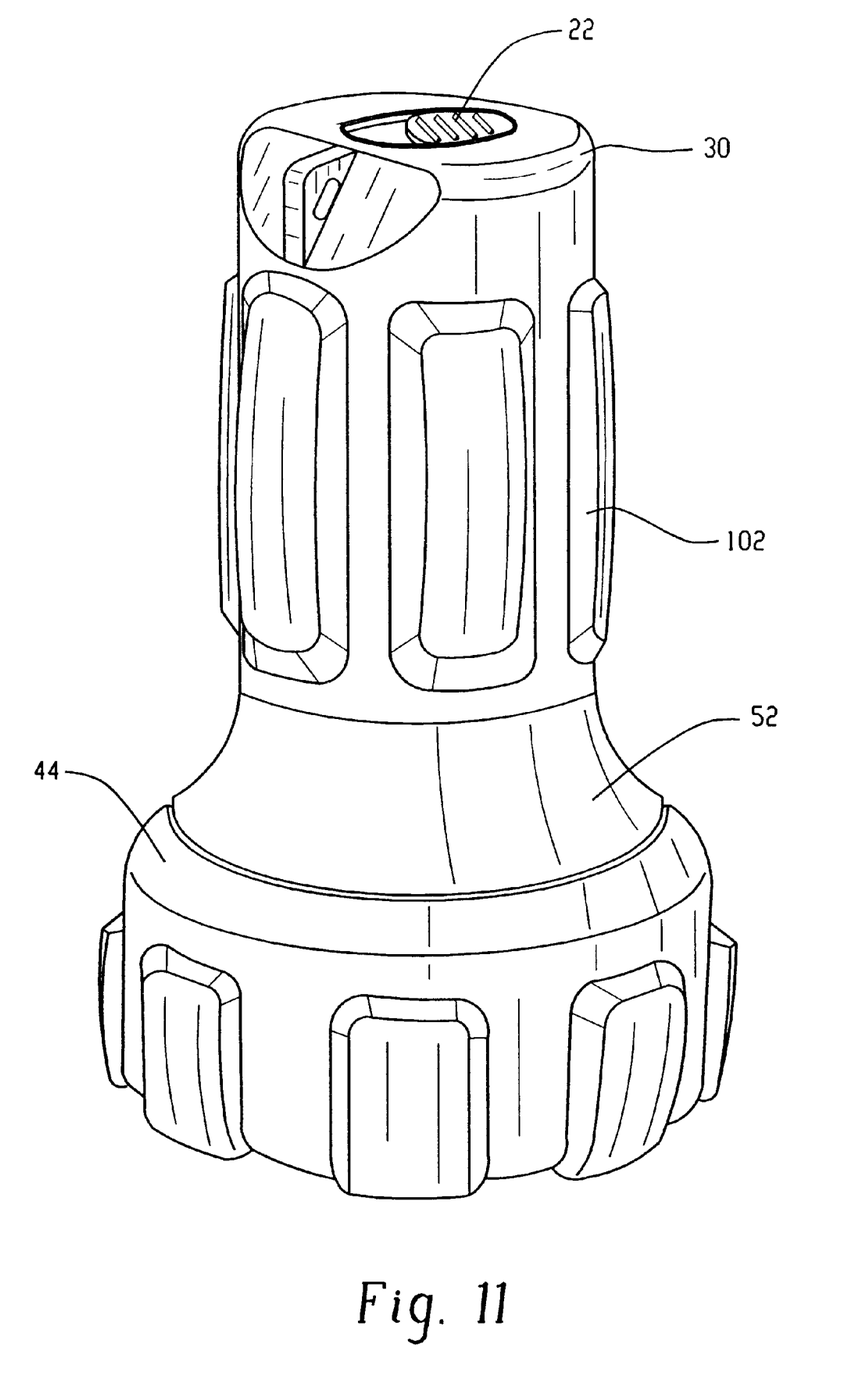
FIG. 11 illustrates a perspective view of the embodiment depicted in FIG. 9, in flashlight mode.

A cylindrical lens 38 is mounted to the forward end 20 of the body 12 by means of clips 54. Alternatively, the cylindrical lens 38 can be attached to the body 12 by a bayonet type fitting or a screw thread arrangement indicated at numeral 40 in FIG. 9. The lens 38 is formed of a translucent or transparent material.

A parabolic reflector 42 is mounted to a cylindrical sleeve 44 which is slideable relative to the cylindrical lens 38 between a retracted position as shown in FIG. 1 and an extended position as shown in FIG. 2. As the sleeve 44 slides forward and backwards between these two positions the parabolic reflector 42 moves with the sleeve. It will be noted that the parabolic reflector 42 has an opening 46 therein which is shaped and sized to receive the lamp 32 therethrough when the sleeve 44 is in its retracted position.

When in the retracted position, as shown in FIG. 1, the lamp 32 projects through the reflector 42 as shown and light from the lamp will be projected as a beam forwardly by the reflector in the manner of a standard flashlight.

When the sleeve 44 is slid forward to the extended position, the lamp 32 will be located behind the reflector 42 and light from the lamp 32 will shine laterally, that is, through the cylindrical lens 38 radiating 360° from the flashlight 10. It will be noted that since the sleeve 44 has been slid forward a greater area of the cylindrical lens 38 will be exposed so that a reasonably widely distributed light will shine from the lamp 32, much in the manner of a lantern. It is preferred that the sleeve 44 is formed of an opaque material but this is not essential. It is preferred that the back surface of the reflector 42 is silvered or moulded from a polymeric or plastic material which is white in colour or otherwise coloured silver or white to aid in the dispersion of light outwardly through the lens 38 when the reflector 42 is in the extended position.

A translucent disc 48 is mounted to the forward end of the sleeve 44 by means of clips 50. The translucent disc 48 is adapted to protect the reflector 42 and the lamp 32 against damage or dirt.

The cylindrical lens 38 is connected, via a tapered transition section 52, to the body 12. This tapered transition section 52 allows the body 12 to be of a smaller diameter than the diameter of the cylindrical lens 38. This arrangement is considered advantageous since it allows for a reduced sized body which can be easily gripped in the hand of a user whereas the cylindrical lens 38 can be of a relatively large diameter to allow for optimal light diffusion therethrough. Clips 54 are used to connect the cylindrical lens to the body 12.

In an alternative arrangement, the mounting plate can have a projection on one end to be received by a cavity in the body 12. At a diametric location on the mounting plate a biased latch can be positioned by this arrangement the mounting plate levers the dry cells against the bias of springs in bottom of the dry cell cavity, until the latch engages a striker plate formation in the body 12. In both arrangements, preferably the lamp is held secured into its mount by a screw down or fitting.

An advantage of the sliding reflector 42 is that it permits the beam emitting from a lamp 32 to be focussed. It will be appreciated that by moving the sleeve 44 a short distance forward from that depicted in FIG. 1 the beam will still emit through the forward end 20 of the flashlight 10 but the focus of that beam will change on account of a change of the position of the reflector 42 relative to the lamp 32. This ability to focus the beam is considered advantageous, and the simple manner in which this is achieved with the present invention is considered to be an important aspect of the invention. Prior art flashlights which have allowed for beam focus have used a complicated cam arrangement for moving the lamp relative to the reflector lens. With the present arrangement the lamp is held fixed in position, which simplifies manufacture, and the reflector, being slideable in the manner described above achieves the beam focus.

The end cap 30 has a circumferential skirt 102 which extends up one side of the body 12 from the rearward end 18 toward the forward end 20. The presence of the skirt 102 extending along the body produces a curved step which acts as locating formation when the flashlight is in use. In use the step is readily located between a user's index and middle finger so that the index finger is closer to the central longitudinal axis of the flashlight compared to the middle and other two fingers. This provides a positive abutment surface to prevent the flashlight sliding forwardly out of a person's hand in use. The skirt 102 also serves an additional purpose of strengthening the body where the skirt overlies the body. In the case of droppage of the flashlight the extra protection afforded by the skirt 102 is an advantage.

Figure 4:
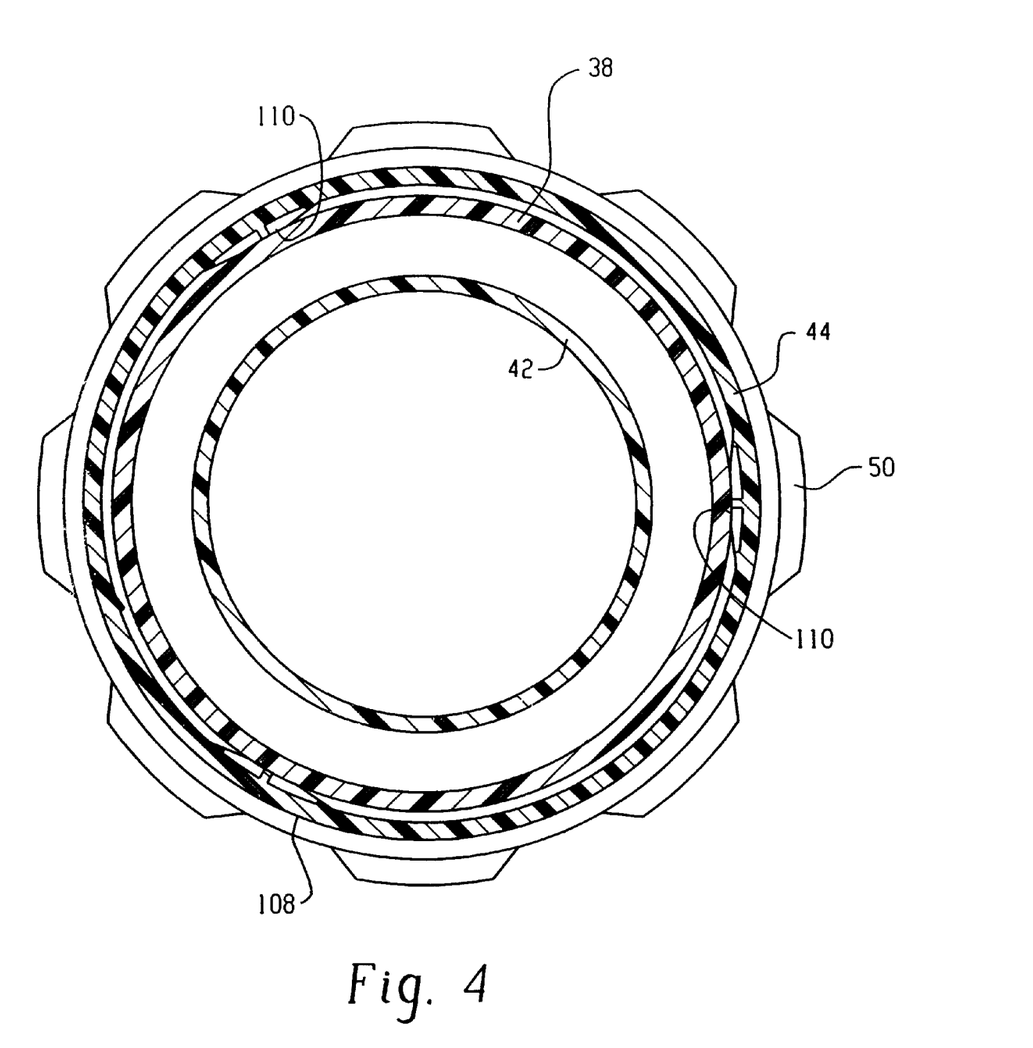
FIG. 4 shows a cross section through the lens assembly of FIG. 1.

As illustrated in FIG. 4 which is a cross section throughout the lens assembly the cylindrical lens is provided on its outer surface with three flat surfaces 108. The inner surface of the sleeve has three corresponding ribs 110 arranged to co-operate with the flat surfaces 108 to prevent rotation of the sleeve relative to the lens 38.

As illustrated in FIG. 1 the lighting device may also include a strap having a first end pivotally connected to the body at a strap mounting spigot 154 and a second end having a quick release or bayonet fitting 156 thereon. The body of the lighting device is adapted to receive the fitting 156 in one of the two receiving sockets. The first socket 158 is located at the rearward end of the body, diametrically opposite the strap mounting spigot 154. When the fitting is operatively located in the first socket 158 the strap can conveniently be used to carry the lighting device in lantern mode. The second socket 160 is located near the front end of the sleeve. The second socket extends through the sleeve 44 and into the cylindrical lens 38. When the fitting 156 is operatively located in the second socket 160 the cylindrical sleeve 44 is locked in position to the lens 88 by the cooperation of the front end 162 of the fitting 156 and a projection 164 located at the back of the reflector 42. Thus with the strap in this second socket 160, the lighting device may be carried in flashlight mode using the strap without the sleeve 44 slipping forward into lantern mode.

Illustrated in FIGS. 5 to 8 is a second embodiment of the invention. The lighting device 200 has an end cap 202 mounted on a body 206 (see FIG. 6). Also mounted on the body 206 is a lantern lens 204 which is slidably mounted on the forward end of the body 206. The end cap 202 is rigidly connected to the body 206. The body 206 includes a battery or dry cell cavity 208 which is closed off by the lamp holder assembly 210 by means of a screw cap 212. To assemble the dry cells into the dry cell cavity 208 the screw cap 212 is undone thereby drawing out the lamp assembly 210 from the body 206. This allows the dry cells to be removed from the dry cell cavity 208.

The tightening of the screw cap 212 onto the body 206 allows the dry cells 214 located in the cavity 208 to contact the terminals 216 at the lamp end of the body and terminals 218 at the other end of the body. A switch 220 in the end cap 202 can be slid in the downward direction relative to the FIG. 6 so that terminal 222 can close the circuit of the dry cells 214 lamp 224.

Figure 6:
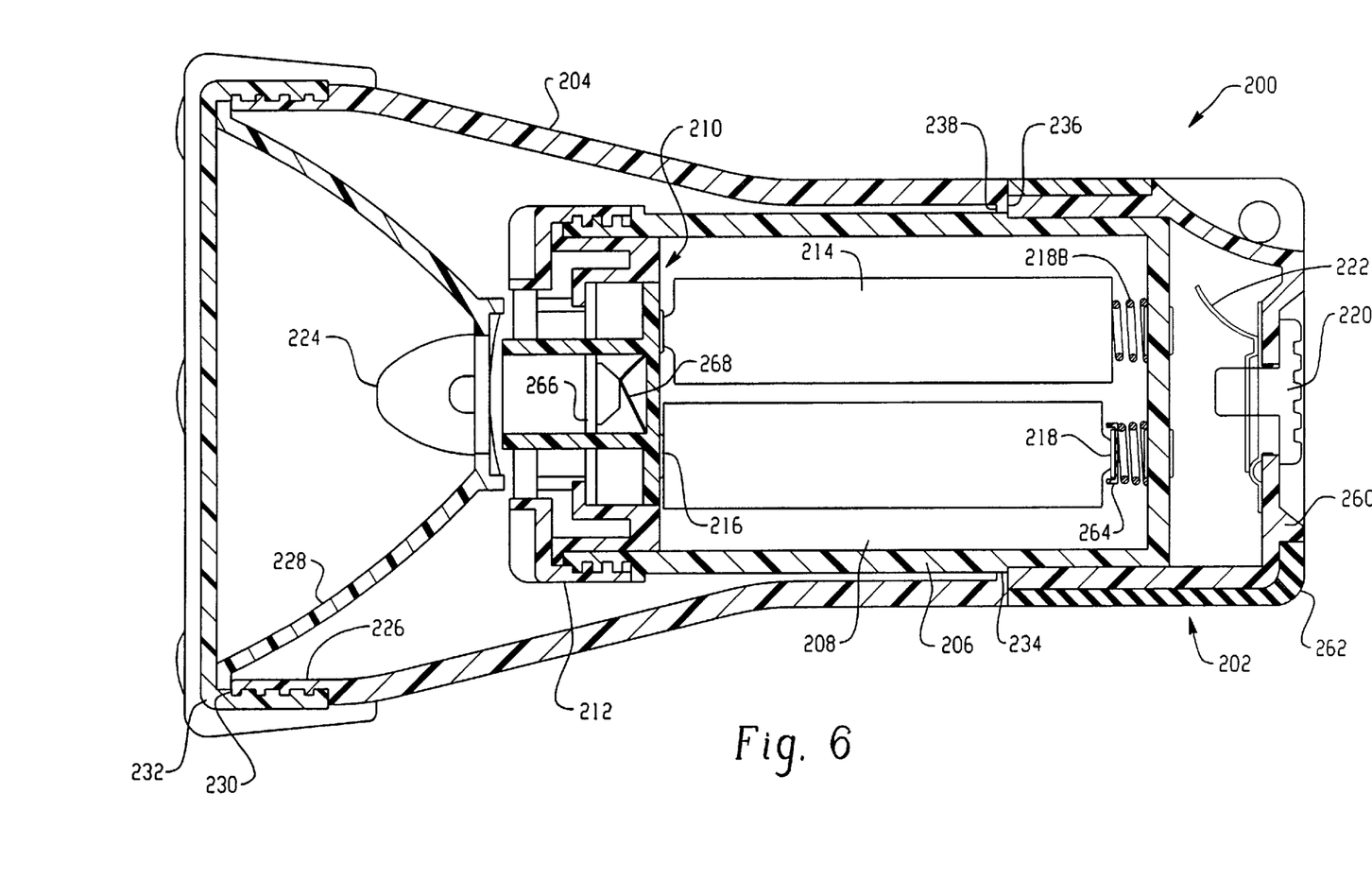
FIG. 6 illustrates a cross section through the apparatus of FIG. 5.
Figure 7:
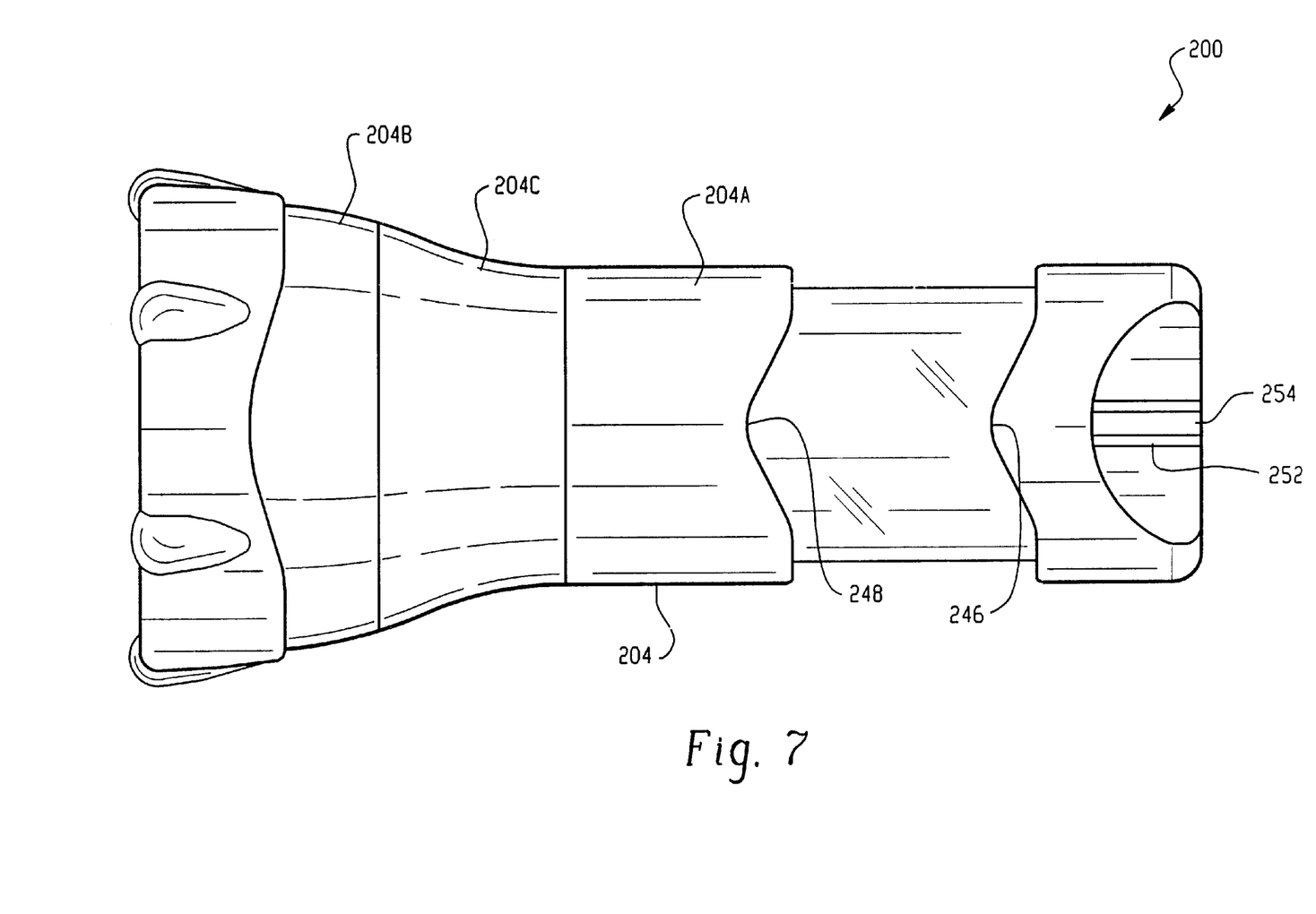
FIG. 7 illustrates the apparatus of FIG. 6 in lantern mode.

The area lens 204 preferably includes a threaded end 226 by which a parabolic reflector 228 can be clamped between the rim 230 of the lantern lens 204 and an annular rim 232.

Figure 8:
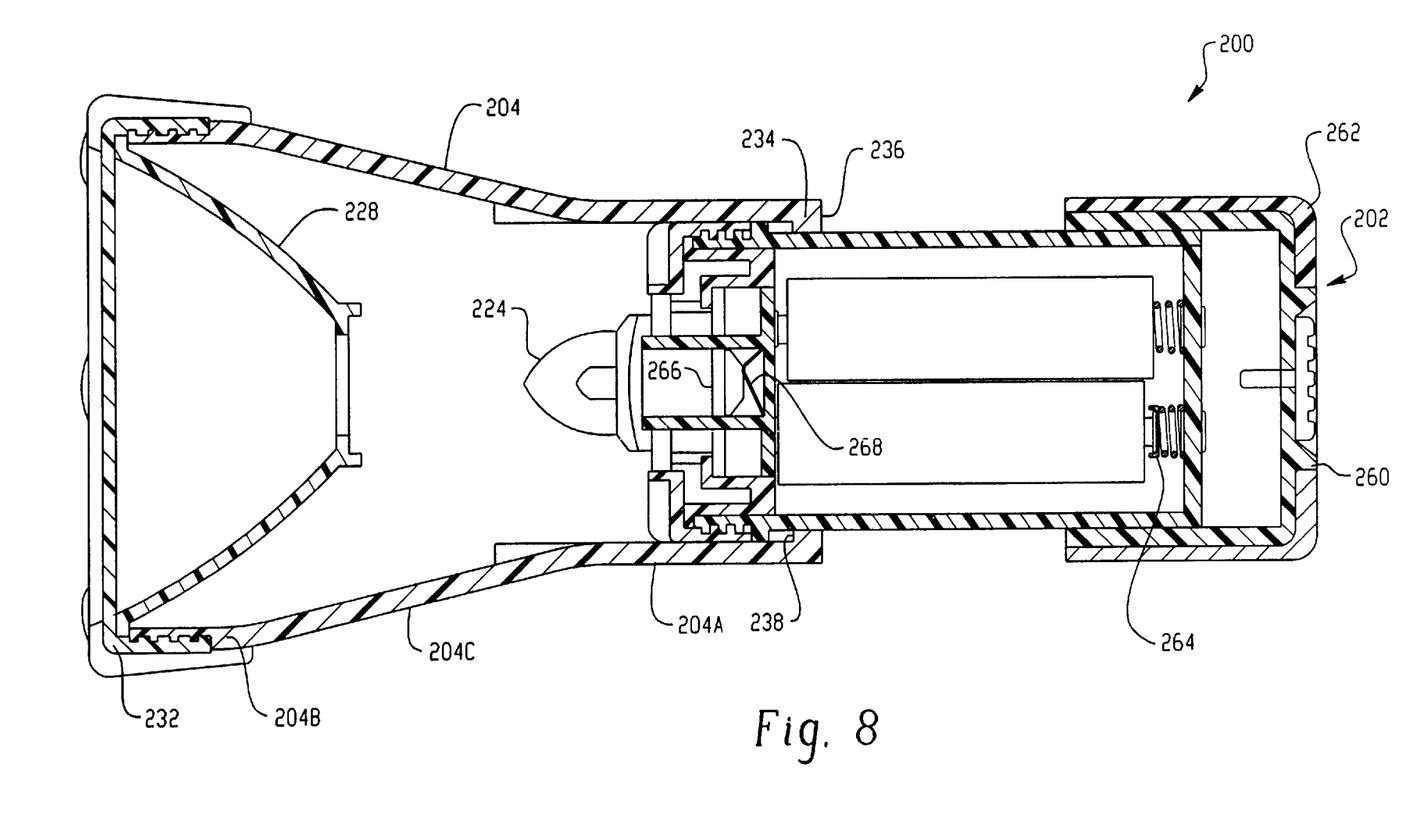
FIG. 8 illustrates a cross section through the apparatus in the mode depicted in FIG. 7.

At the rear of the lantern lens 204 is an inwardly directed radial flange 234. The rearward face 236 of the flange 234 provides an abutment surface to abut the end cap 202. The forward face 238 of the flange 234 provides an abutment surface for the lantern lens 204 when the lantern lens is moved forward with respect to the body 202 to the orientation indicated in FIG. 8. The abutment surface 238 will engage the detent 240 on the body 202 which is adjacent to the threaded portion 242. In FIG. 8 the lantern lens 204 is shown in an almost fully extended position with only a small amount of travel tube remaining until abutment surface 238 engages detent 240. The lens ring 232 includes an annular rubber shield 244 which has a series of raised rubber projections 246 around the circumference thereof.

Figure 5:
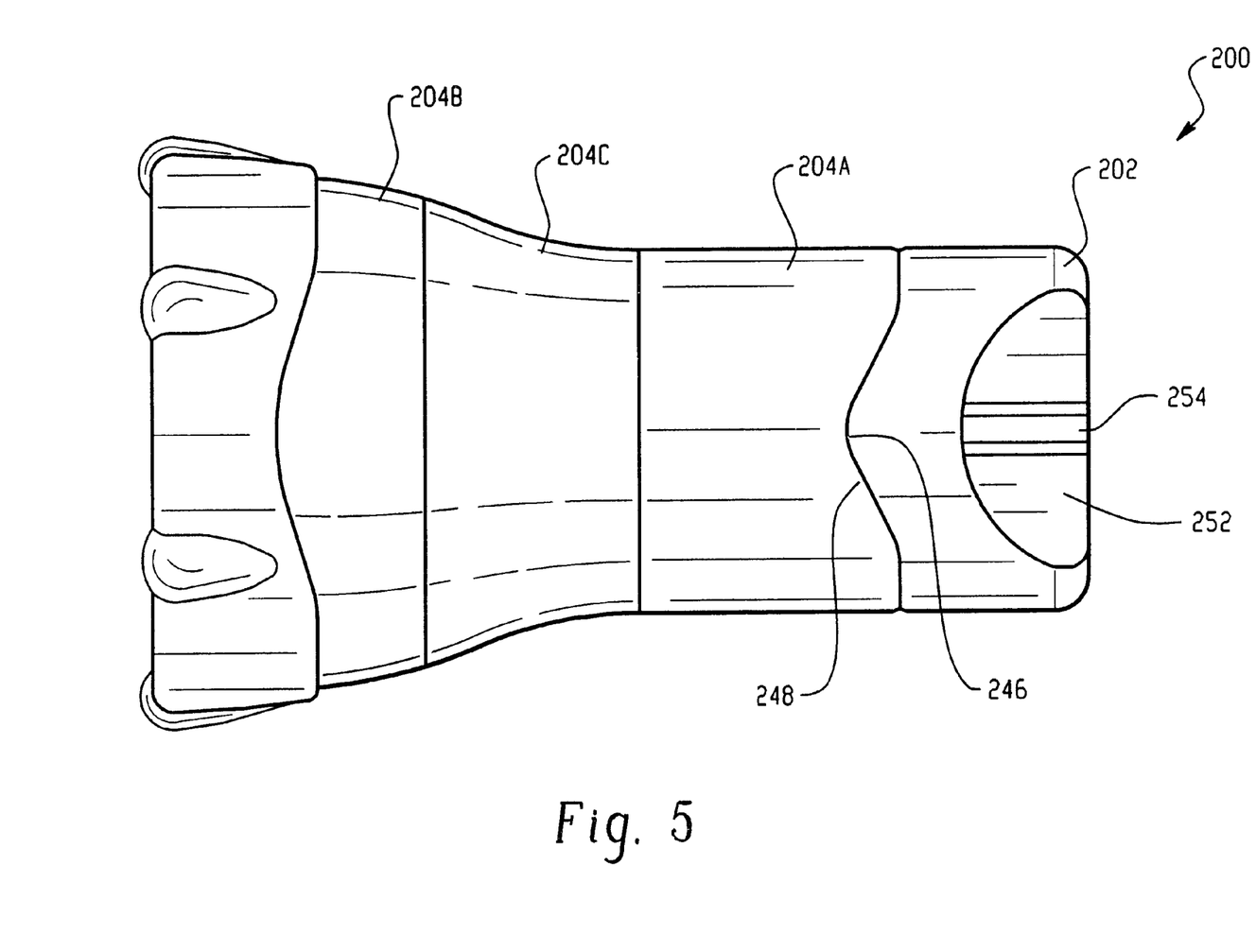
FIG. 5 illustrates a side view of a second embodiment, in flashlight mode.

As illustrated in FIG. 5 the end cap 202 includes a projection 246 while the area light has a mating recess 248 of a complementary shape. Whilst the recess 248 and projection 246 serve an aesthetic purpose they can, if desired serve a functional purpose. By rotation of the lantern lens 204 relative to the body 206 in either a clockwise or anti-clockwise direction relative to the end cap 202 the area lens 204 will, as it rotates slid in the direction of arrow 250. This will allow for some focussing of the beam of light emitted from the reflector 228 when the lighting device 200 is in flashlight mode as illustrated in FIGS. 6 and 5.

The end cap 202 has a cut away portion 252 on either side of a strap mounting spigot 254.

Preferably the lantern lens 204 is manufactured from a transparent or translucent or frosted material.

It will be noted that the lantern lens 204, although generally cylindrical, has a narrow diameter portion 204A, and a wide claimer portion 204B, integrally joined together by a transitional tapered portion 204C. This configuration permits the reflector 228 to have a wide diameter which permits the flashlight beam which is projected forward by the reflector 228 to be of a reasonably wide diameter.

The end cap 202 is manufactured from a piece of relatively hard plastic as an underlayer 260 which houses or receives the on/off switch 220. Around the outside periphery of the layer 260 is a soft or pliable layer preferably of rubber or other polymeric material 262. The lower terminal 218 as illustrated in FIGS. 6 and 8 has a protective plastic cover 264 surrounding the terminal 218. This ensures that if a battery 214 is inserted in an incorrect orientation inside the cavity 208 the negative terminal of the battery will not make contact with the lower terminal 218B.

The lamp 224 is preferably held in the lamp mounting plate by means of a bayonet clip arrangement 266 which holds the lamp 224 in position against the bias provided by terminal plate 268 which is connected to the positive end of the series connected batteries 214.

The invention is not limited to the configuration of components as depicted in the drawings. Clearly it is not essential that the body be of lesser diameter than the cylindrical lens 38. Also, the dry cell arrangement and the manner in which the dry cells are housed within the body can differ from that described herein without departing on the scope of the invention. Likewise, the on/off switch can be configured differently from that described herein and need not be located in the base of the flashlight, although this is the preferred arrangement.

What is claimed is:

1. A lighting device comprising:
    a generally tubular body having a dry cell cavity adapted to contain one or more dry cells for powering the lighting device, the body having a rearward end and a forward end,
    a cylindrical translucent lens fixedly mounted to the forward end of the body,
    a lamp mounted to the body at or adjacent to the forward end thereof, said lamp adapted to be electrically connected to dry cells contained within the body,
    a generally parabolic or cone shaped reflector slidably mounted relative to the cylindrical lens and located within the interior of the cylindrical lens, the reflector having an opening in the centre thereof shaped to receive at least part of the lamp therethrough, and
    the reflector being slideable in an axial direction between an extended position in which the reflector is spaced away from the lamp and light emitting from the lamp in use shines through the cylindrical lens, and a retracted position in which the lamp extends at least part way through the opening in the reflector, and light emitting from the lamp in use is reflected in a forward direction by the reflector.

2. A lighting device according to claim 1 wherein the reflector is mounted to a cylindrical sleeve which is slidably mounted to the cylindrical lens.

3. A lighting device according to claim 2 wherein the cylindrical sleeve is of larger diameter than the cylindrical lens.

4. A lighting device according to claim 3 wherein a sealing ring is located between the outer surface of the cylindrical lens and the inner surface of the cylindrical sleeve.

5. A lighting device according to claim 4 wherein the sealing ring comprises a ring seal mounted to the cylindrical sleeve, and slidable on the cylindrical lens.

6. A lighting device according to claim 2 wherein the cylindrical sleeve has a protective translucent disc mounted to the forward end thereof which protects the reflector and the lamp.

7. A lighting device according to claim 1 wherein the body is of lesser diameter than the cylindrical lens and a tapered transition section joins the body to the cylindrical lens.

8. A lighting device according to claim 7 wherein the tapered transition section is translucent.

9. A lighting device according to claim 8 wherein the tapered transition section has a concave profile in side elevation.

10. A lighting device according to claim 8 wherein the tapered transition section is formed integrally with the cylindrical lens.

11. A lighting device according to claim 1 wherein a rearward portion of the cylindrical lens is visible when the reflector is in its retracted position.

12. A lighting device according to claim 1 wherein the lamp is mounted on a removable mounting plate which, when removed, exposes the dry cell cavity to allow for dry cell replacement.

13. A lighting device according to claim 12 and further including a hub that is held in position on the body by the cylindrical lens, and the cylindrical lens is removable from the body so as to allow the hub to be removed for dry cell replacement.

14. A lighting device according to claim 13 wherein the hub and the body have co-operant formations for aligning and centering the hub relative to the body.

15. A lighting device according to claim 2 including a strap having a first end pivotally connected to the body and a second end having a quick release or bayonet fitting thereon, the body including a first receiving socket therein adapted to receive said second end therein, and the cylindrical sleeve including a second receiving socket for receiving the second end therein, the cylindrical sleeve being locked in position relative to the cylindrical lens when the second end is operatively located in said second socket.

16. A lighting device according to claim 15 wherein the strap includes swivel means which allows the two ends of the strap to rotate relative to each other through 180° on an axis coincident with the length of the strap.

17. A lighting device comprising:
    a generally tubular body having a dry cell cavity adapted to contain one or more dry cells for powering the lighting device, the body having a rearward end and a forward end;
    a generally cylindrical translucent lens slideably mounted to the outside of the body and extending forwardly of the forward end of the body;

a lamp mounted to the body at or adjacent to the forward end thereof, said lamp adapted to be electrically connected to said dry cell or cells contained within the body;

a generally parabolic or cone shaped reflector fixedly mounted to the cylindrical lens and located within the cylindrical lens, the reflector having an opening in the center thereof shaped to receive at least part of the lamp therethrough; and the reflector and tubular lens being slideable in an axial direction between an extended position in which the reflector is spaced away from the lamp and light emitting from the lamp in use shines through the tubular lens, and a retracted position in which the lamp extends at least part way through the opening in the reflector, and light emitting from the lamp in use is reflected in a forward direction by the reflector;

the rearward end of the cylindrical translucent lens being of lesser diameter than the forward end thereof;

wherein the rearward end of the cylindrical lens has locating formations defined therein, and the rearward end of the body has a forwardly projecting shoulder formed thereon with co-operant forwardly projecting formations formed thereon which engage with said locating formations on the cylindrical lens.

18. A lighting device according to claim 17 wherein the cylindrical lens is translucent over substantially its entire length.

19. A lighting device according to claim 17 wherein the forward end of the device has an elastomeric protective ring surrounding the reflector, the protective ring having a series of radially outwardly projecting protrusions thereon of generally rectangular shape and spaced apart from each other.

\* \* \* \* \*